United States Patent [19] [11] 4,194,132
Mrazek [45] Mar. 18, 1980

[54] TRISTATE LOGIC BUFFER CIRCUIT WITH REDUCED POWER CONSUMPTION

[75] Inventor: Dale A. Mrazek, Los Altos Hills, Calif.

[73] Assignee: National Semiconductor Corporation, Santa Clara, Calif.

[21] Appl. No.: 910,384

[22] Filed: May 30, 1978

[51] Int. Cl.² .................. H03K 3/29; H03K 19/08
[52] U.S. Cl. .................. 307/209; 307/317 A; 307/270; 307/299 A
[58] Field of Search .......... 307/209, 289, 270, 254, 307/299 A, 300, 296, 317 A

[56] References Cited

U.S. PATENT DOCUMENTS

| | | | |
|---|---|---|---|
| 3,602,733 | 8/1971 | Aoki | 307/209 |
| 3,792,292 | 2/1974 | Priel | 307/209 |
| 4,081,695 | 3/1978 | Allen et al. | 307/209 |

Primary Examiner—Stanley D. Miller, Jr.
Assistant Examiner—B. P. Davis
Attorney, Agent, or Firm—Brown & Martin

[57] ABSTRACT

A current mirror transistor is included in a tristate logic buffer circuit, with its base and emitter respectively connected to the base and emitter of the phase splitter transistor and its collector connected to the voltage supply terminal. A high resistance connected between the voltage supply terminal and the collector of the phase splitter transistor causes the circuit to consume less power when the circuit is disabled; and the current mirror transistor supplements the drive current provided by the phase splitter transistor when the circuit is not disabled.

6 Claims, 3 Drawing Figures

TRISTATE LOGIC BUFFER CIRCUIT WITH REDUCED POWER CONSUMPTION

CROSS REFERENCE TO RELATED APPLICATION

This application is related to an application Ser. No. 910,383 entitled "Tristate Logic Buffer Circuit With Enhanced Dynamic Response" filed on even date herewith by the named inventor herein and Robert Michael Reinschmidt.

BACKGROUND OF THE INVENTION

The present invention is generally directed to tristate logic buffer circuits and is particularly directed to reducing the power consumption by such a circuit when the circuit is in a disabled state.

A typical prior art tristate logic buffer circuit is shown in FIG. 1. This circuit includes an input transistor Q1, a phase splitter transistor Q2, a pull-down output transistor Q3, a pull-up output transistor Q4, a current amplifying transistor Q5, first resistance R1, a second resistance R2, a third resistance R3, a fourth resistance R4, a fifth resistance R5, a diode D1 and an inverter 10. The circuit also has a date input terminal 12, a data output terminal 14, a circuit disable terminal 16, and a circuit control terminal 18.

The input transistor Q1 is a multi-emitter transistor, having a first emitter connected to the data input terminal 12 for receiving a digital data input signal. The first resistance R1 couples the base of the input transistor Q1 to the voltage supply terminal $V_{cc}$. The phase splitter transistor Q2 has its base coupled to the collector of the input transistor Q1. The second resistance R2 couples the collector of the phase splitter transistor Q2 to the voltage supply terminal $V_{cc}$. The pull-down output transistor Q3 has its base coupled to the emitter of the phase splitter transistor Q2, its emitter coupled to a circuit ground terminal, and its collector connected to the data output terminal 14. The third resistance R3 is connected between the base and emitter of the pull-down output transistor Q3. The pull-up output transistor Q4 has its emitter connected to the data output terminal 14, its collector coupled through the resistance R4 to the voltage supply terminal $V_{cc}$ and its base coupled through the current amplifying transistor Q5 to the collector of the phase splitter transistor Q2. The current amplifying transistor Q5 has its emitter connected to the base of the pull-up output transistor Q4, its base connected to the collector of the phase splitter transistor Q2, and its collector connected to the collector of the pull-up output transistor Q4. Resistance R5 is connected between the base of the pull-up output transistor Q4 and circuit ground.

The circuit disable terminal 16 is connected to a second emitter of the input transistor Q1, and is coupled to the circuit control 18 terminal through the inverter 10. The diode D1 has its anode connected to the collector of the phase splitter transistor Q2 and its cathode connected to the circuit disable terminal 16. The circuit is disabled when a "high" logic signal is applied to the circuit control terminal 18, whereby the inverter 10 causes a "low" logic signal to be applied at the circuit disable terminal 16.

When a "high" logic signal is applied at the circuit disable terminal 16, a digital data output signal that is the logical complement of the digital data input signal at input terminal 12, is provided at the data output terminal 14. When a "low" logic signal is applied at the circuit disable terminal 16, the circuit has a high output impedance between the data output terminal 14 and circuit ground to inhibit the provision of the digital data output signal at the output terminal 14.

It is an object of the present invention to reduce the power consumed by the circuit when the circuit is in its disabled state. This object is particularly desirable because tristate logic buffer circuits typically are in their disabled state for a majority of the time in which they are in use.

SUMMARY OF THE INVENTION

The present invention is an improved tristate logic buffer circuit which is characterized by a current mirror transistor having its base and emitter respectively connected to the base and emitter of the phase splitter transistor and its collector connected to the voltage suppply terminal.

The current mirror transistor supplements the drive current that is provided by the phase splitter transistor to the pull-down output transistor, and thereby enables a higher resistance to be connected between the voltage supply terminal and the collector of the phase splitter transistor without diminishing the drive current to the pull-down output transistor. By connecting a higher resistance between the voltage supply terminal and the collector of the phase splitter transistor, the current flow through the phase splitter transistor and resultant power consumption are reduced when the circuit is in its disabled state.

The ratio of the emitter size of the current mirror transistor to the emitter size of the phase splitter transistor is scaled in accordance with how much current is required to drive the pull-down output transistor.

An additional advantage realized as a result of the current mirror transistor having its base and emitter respectively connected to the base and emitter of the phase splitter transistor and its collector connected to the voltage supply terminal is a faster dynamic response in the conduction state of the pull-down output transistor to a positive going change in the level of the digital data input signal. This faster dynamic response occurs because, whereas there is a Miller feedback effect on the phase splitter transistor which has its collector coupled to the voltage supply terminal through a resistance, there is minimal Miller feedback effect upon the current mirror transistor which has its collector connected directly to the voltage supply terminal. Thus upon the onset of the transition in the digital data input signal, as received from the collector of the input transistor, the current ratio between the current mirror transistor and the phase splitter transistor is even greater than the ratio of the respective emitter sizes and the dynamic response of the current provided to the pull-down output transistor is enhanced.

The combination of the current mirror transistor and the phase splitter transistor operates in the manner described hereinabove only when the phase splitter transistor is in its linear mode of operation. Therefore the phase splitter transistor preferably is a Schottky transistor so as to assure that such operation will be in the linear mode. It is also preferable that the input transistor and pull-down output transistor, both of which are connected to and affect the operation of the phase splitter transistor likewise be Schottky transistors so that they too maintain their operation in a linear mode and thus not adversely affect the operation of the phase splitter transistor.

Additional features of the present invention are described in the description of the preferred embodiment.

DESCRIPTION OF THE PREFERRED EMBODIMENT

Figure 2:
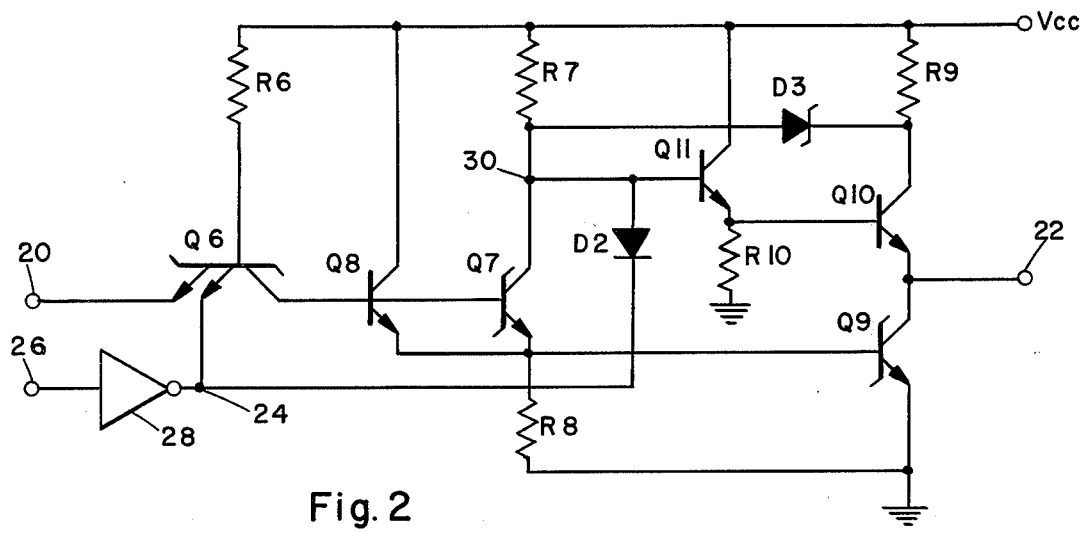
FIG. 2 is a schematic circuit diagram of one preferred embodiment of a tristate logic buffer circuit according to the present invention.

Referring to FIG. 2, a tristate logic buffer circuit according to the present invention includes a multi-emitter input transistor Q6, a phase splitter transistor Q7, a current mirror transistor Q8, a pull-down output transistor Q9, a pull-up output transistor Q10, and a current amplifying transistor Q11.

A first resistance R6 is connected between the base of the input transistor Q6 and the voltage supply terminal $V_{cc}$. A second resistance R7 is connected between the collector of the phase splitter transistor Q6 and the voltage supply terminal $V_{cc}$. A third resistance R8 is connected between the base and emitter of the pull-down output transistor Q9. A fourth resistance R9 is connected between the collector of the pull-up output transistor Q10 and the voltage supply terminal $V_{cc}$.

The circuit includes a data input terminal 20, a data output terminal 22, a circuit disable terminal 24 and a circuit control terminal 26. An inverter 28 couples the circuit control terminal 26 to the circuit disable terminal 24. A first diode D2 has its anode connected to the collector of the phase splitter transistor Q7 and its cathode connected to the circuit disable terminal 24. A second diode D3 has its anode connected to the collector of the phase splitter transistor Q7 and its cathode connected to the collector of the pull-up output transistor Q10.

The input transistor Q6 has a first emitter connected to the data input terminal 20 for receiving a digital data input signal and a second emitter connected to the circuit disable terminal 24. The phase splitter transistor Q7 has its base coupled to the collector of the input transistor Q6. The current mirror transistor Q8 has its base and emitter respectively connected to the base and emitter of the phase splitter transistor Q7 and its collector connected to the voltage supply terminal $V_{cc}$. The pull-down output transistor Q9 has its base coupled to the emitter of the phase splitter transistor Q7, its emitter coupled to a circuit ground terminal, and its collector connected to the data output terminal 22. The pull-up output transistor Q10 has its emitter connected to the data output terminal 22, its collector coupled to the voltage supply terminal $V_{cc}$, and its base coupled to the collector of the phase splitter transistor Q7. The current amplifying transistor Q11 has its emitter connected to the base of the pull-up output transistor Q10, its base connected to the collector of the phase splitter transistor Q7 and its collector connected to the voltage supply terminal $V_{cc}$.

The circuit is disabled when a "high" logic signal is applied to the circuit control terminal 26, whereby the inverter 28 causes a "low" logic level signal to be applied at the circuit disable terminal 24. When a "low" logic signal is applied at the circuit disable terminal 24, the circuit has a high output impedance between the data output terminal 22 and circuit ground to inhibit the provision of a digital data output signal at the data output terminal 22.

When a "high" logic signal is applied at the circuit disable terminal 24, a digital data output signal that is the logical complement of the digital data input signal at input terminal 20 is provided at the data output terminal 22.

The current mirror transistor Q8 supplements the drive current that is provided by the phase splitter transistor Q7 to the pull-down transistor Q9 and thereby enables the resistance R7 that is connected between the voltage supply terminal $V_{cc}$ and the collector of the phase splitter transistor Q7 to be high without diminishing the drive current to the pull-down output transistor Q9. By connecting a high resistance R7 between the voltage supply terminal $V_{cc}$ and the collector of the phase splitter transistor Q7, the current flow through the phase splitter transistor Q7 and resultant power consumption are reduced when the circuit is in its disabled state.

Figure 1:
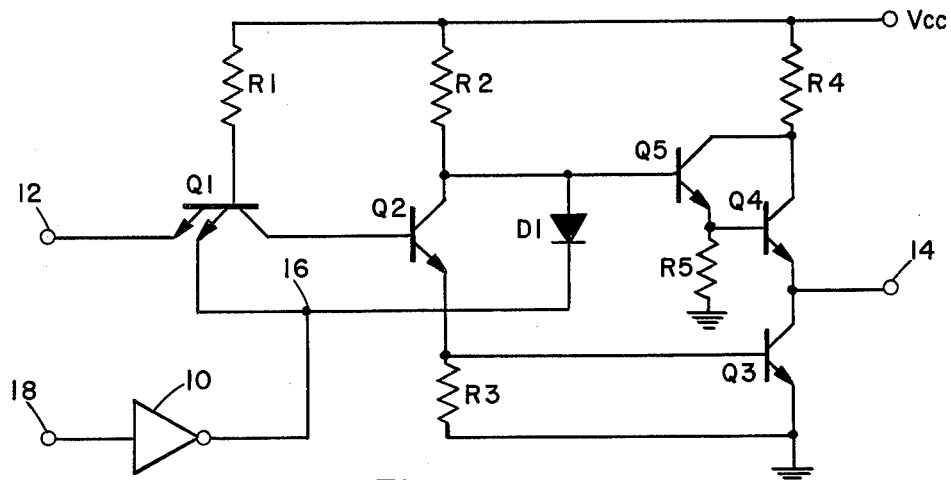
FIG. 1 is a schematic circuit diagram of a prior art tristate logic buffer circuit.

As mentioned previously, the collector of the current amplifying transistor Q11 is connected directly to the voltage supply terminal $V_{cc}$, instead of to the collector of the pull-up output transistor Q10 as in the prior art tristate logic buffer circuit discussed in relation to FIG. 1. This feature reduces the dynamic capacitance at the node 30 at which the base of the current amplifying transistor Q11 is connected to the collector of the phase splitter transistor Q7. As a result the transition to a positive voltage at the node 30 is faster.

The second diode D3 protects the circuit from burnout in the event that the output terminal 22 is inadvertently connected directly to circuit ground potential. The diode D3 is a Schottky diode. Alternatively the diode D3 may be a diffused diode.

The input transistor Q6, the phase splitter transistor Q7 and the current mirror transistor Q8 are Schottky transistors so as to assure their respective operations in a linear mode. Alternatively any or all of these transistors may be a diffused transistor having a diode connected between its base and collector, with the anode of the diode being connected to the base of the transistor.

Figure 3:
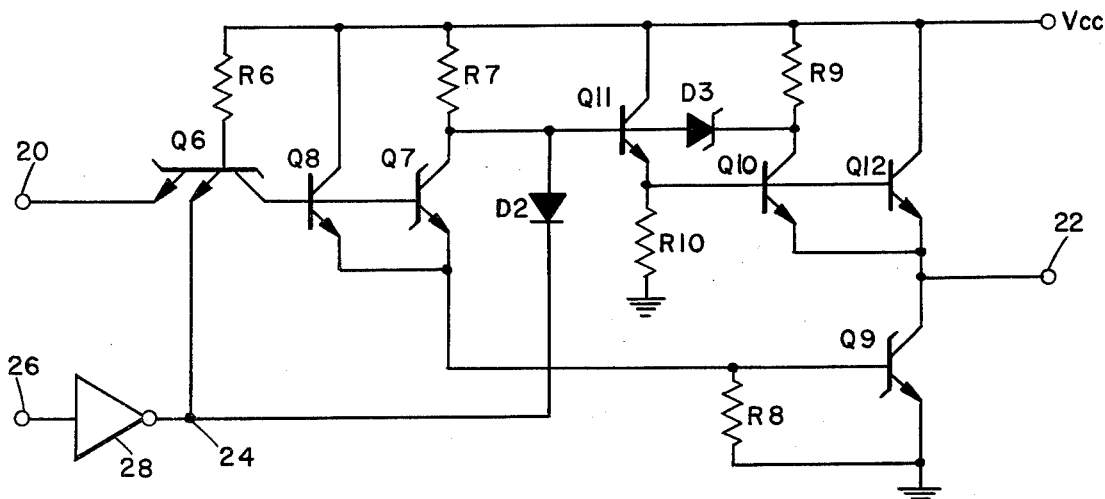
FIG. 3 is a schematic circuit diagram of another preferred embodiment of a tristate logic buffer circuit according to the present invention.

The tristate logic buffer circuit of FIG. 3 includes essentially the circuit of FIG. 2, and in addition thereto, further includes a second current mirror transistor Q12 having its base and emitter respectively connected to the base and emitter of the pull-up output transistor Q10 and its collector connected to the supply voltage terminal $V_{cc}$. The ratio of the emitter size of the second current mirror transistor to the emitter size of the pull-up output transistor is scaled in accordance with how much current is required to drive the pull-up output transistor Q10.

The addition of the second current mirror transistor Q12 enhances the dynamic response of the pull-up output transistor Q10 in providing a "high" logic level in the digital data output signal at the data output terminal 22. Whereas there is a Miller feedback effect on the pull-up output transistor Q10, which has its collector coupled to the supply voltage terminal $V_{cc}$ through the resistance R9; there is minimal Miller feedback effect upon the second current mirror transistor Q12 which has its collector connected directly to the voltage supply terminal $V_{cc}$.

Thus upon the onset of a positive transition in the signal at the bases of the transistors Q10, Q12, the current ratio between the second current mirror transistor Q12 and the pull-up output transistor Q10 is even greater than the ratio of their respective emitter sizes and the dynamic response of the pull-up output transistor in providing a "high" logic level in the digital data output signal at the data output terminal 22 is enhanced.

The feature of including a current mirror transistor in a tristate logic buffer circuit to enhance the dynamic response of the pull-up output transistor in providing a "high" logic level in the digital data output signal, such as shown in FIG. 3, is reserved as the subject of a separate patent application by Dale Allen Mrazek the named inventor herein and Robert Michael Reinschmidt.

I claim:

1. A tristate logic buffer circuit, comprising
a data input terminal;
a multi-emitter input transistor, having a first emitter connected to the data input terminal for receiving a digital data input signal;
a voltage supply terminal
a first resistance for coupling the base of the input transistor to the voltage supply terminal;
a phase splitter transistor having its base coupled to the collector of the input transistor;
a second resistance for coupling the collector of the phase splitter transistor to the voltage supply terminal;
a data output terminal;
a pull-down transistor having its base coupled to the emitter of the phase splitter transistor, its emitter coupled to a circuit ground terminal, and its collector connected to the data output terminal;
a third resistance coupled between the base and emitter of the pull-down output transistor;
a pull-up output transistor having its emitter connected to the data output terminal, its collector coupled to the voltage supply terminal, and its base coupled to the collector of the phase splitter transistor;
a circuit disable terminal connected to a second emitter of the input transistor; and
a diode having its anode connected to the collector of the phase splitter transistor and its cathode connected to the circuit disable terminal;
wherein, when a "high" logic signal is applied at the circuit disable terminal, a digital data output signal that is the logical complement of the digital data input signal is provided at the data output terminal; and when a "low" logic signal is applied at the circuit disable terminal the circuit has a high output impedance between the data output terminal and circuit ground to inhibit the provision of said digital data output signal;
wherein the improvement comprises
a current mirror transistor having its base and emitter respectively connected to the base and emitter of the phase splitter transistor and its collector connected to the voltage supply terminal.

2. A tristate logic buffer circuit according to claim 1, wherein the phase splitter transistor is a Schottky transistor.

3. A tristate logic buffer circuit, according to claim 2, wherein the input transistor is a Schottky transistor.

4. A tristate logic buffer circuit according to claim 3, wherein the pull-down output transistor is a Schottky transistor.

5. A tristate logic buffer circuit according to claim 2, wherein the pull-down output transistor is a Schottky transistor.

6. A tristate logic buffer circuit according to claim 1, further comprising a current amplifying transistor having its emitter connected to the base of the pull-up output transistor, its base connected to the collector of the phase splitter transistor, and its collector connected to the voltage supply terminal.

* * * * *